(12) United States Patent
Kajikawa et al.

(10) Patent No.: US 9,670,403 B2
(45) Date of Patent: Jun. 6, 2017

(54) FLUORIDE FLUORESCENT MATERIAL AND METHOD FOR PRODUCING THE SAME

(71) Applicant: Nichia Corporation, Anan-shi, Tokushima (JP)

(72) Inventors: Koji Kajikawa, Tokushima (JP); Kazushige Fujio, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 265 days.

(21) Appl. No.: 14/581,160

(22) Filed: Dec. 23, 2014

(65) Prior Publication Data

US 2015/0184067 A1 Jul. 2, 2015

(30) Foreign Application Priority Data

Dec. 27, 2013 (JP) ................................. 2013-273412
Jun. 5, 2014 (JP) ................................. 2014-116661

(51) Int. Cl.

| C09K 11/61 | (2006.01) |
|---|---|
| C09K 11/02 | (2006.01) |
| H05B 33/12 | (2006.01) |
| C09K 11/64 | (2006.01) |
| H01S 5/00 | (2006.01) |
| H01L 33/50 | (2010.01) |
| H01S 5/323 | (2006.01) |

(52) U.S. Cl.
CPC .......... *C09K 11/025* (2013.01); *C09K 11/645* (2013.01); *H01S 5/005* (2013.01); *H01L 33/502* (2013.01); *H01S 5/32341* (2013.01)

(58) Field of Classification Search
CPC ...... C09K 11/025; C09K 11/57; H10L 33/502
See application file for complete search history.

(56) References Cited

U.S. PATENT DOCUMENTS

| 8,057,706 B1 | 11/2011 | Setlur et al. |
|---|---|---|
| 2010/0090585 A1 | 4/2010 | Seto et al. |
| 2013/0257264 A1* | 10/2013 | Tamaki ................... B05D 5/06 313/503 |

FOREIGN PATENT DOCUMENTS

| JP | 2006-028458 | 2/2006 |
|---|---|---|
| JP | 2008-274254 A | 11/2008 |
| JP | 2010-209331 | 9/2010 |
| JP | 2011-012091 | * 1/2011 |
| JP | 2011012091 A | 1/2011 |
| JP | 2013-533363 A | 8/2013 |
| JP | 2013-203822 | 10/2013 |
| JP | 2013247067 A | 12/2013 |

OTHER PUBLICATIONS

Translation for JP 2011-012091 parts A and B, Jan. 20, 2011.*
Office Action (with English translation) issued on Sep. 27, 2016 in Japanese Patent Application No. 2014-116661.

* cited by examiner

*Primary Examiner* — Carol M Koslow
(74) *Attorney, Agent, or Firm* — Andrews Kurth Kenyon LLP

(57) ABSTRACT

A fluoride fluorescent material, comprising:
a fluoride particles having a chemical composition represented by the formula (I):

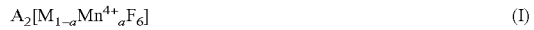

$$A_2[M_{1-a}Mn^{4+}{}_aF_6] \qquad (I)$$

wherein A is at least one cation selected from the group consisting of $K^+$, $Li^+$, $Na^+$, $Rb^+$, $Cs^+$ and $NH_4^+$; M is at least one element selected from the group consisting of elements from Group 4 of the periodic table and elements from Group 14 of the periodic table; and variable a satisfies $0<a<0.2$; and a thermally-conductive substance having a higher thermal conductivity than the fluoride particles, and that is arranged on at least a portion of a surface of the fluoride particles, and a method for producing the fluoride fluorescent material.

12 Claims, 7 Drawing Sheets

FLUORIDE FLUORESCENT MATERIAL AND METHOD FOR PRODUCING THE SAME

CROSS-REFERENCE TO RELATED APPLICATIONS

This application claims priority under 35 USC 119 from Japanese patent Application No. 2013-273412, filed on Dec. 27, 2013 and Japanese patent Application No. 2014-116661, filed on Jun. 5, 2014, the disclosures of which are incorporated by reference herein.

BACKGROUND OF THE INVENTION

Field of the Invention

The present description relates to a fluoride fluorescent material and a method for producing the fluoride fluorescent material.

Description of the Related Art

A light emitting diode (LED) is a semiconductor light emitting element produced from a metal compound such as gallium nitride (GaN). Various types of light emitting devices that emit light of, e.g., white color, an incandescent bulb color, or orange color have been developed using such a semiconductor light emitting element in combination with a fluorescent material. Such light emitting devices are enabled to emit, e.g., white light by the light color mixture principle. Well known systems that emit white light include systems using a light emitting element that emits ultraviolet light and three types of fluorescent materials that emit red (R), green (G), and blue (B) light, and systems using a light emitting element that emits a blue light and a fluorescent material that emits, e.g., a yellow light. Light emitting devices that employ systems using a light emitting element that emits a blue light and a fluorescent material that emits, e.g., a yellow light are demanded in a wide variety of fields, including lighting such as fluorescent lamps, car lights, displays, and backlights for liquid crystals. Of these, fluorescent materials used in displays are desired to have both superior light emission efficiency and superior color purity for reproducing colors in a wide range of the chromaticity coordinates. Fluorescent materials used in displays are particularly desired to be advantageously used in combination with color filters and to have an emission peak with a narrow half band width.

Red-light emitting fluorescent materials exhibiting an emission peak with a narrow half band width and having an excitation band in the blue region, fluoride fluorescent materials having, for example, compositions, such as $K_2AlF_5:Mn^{4+}$, $K_3AlF_6:Mn^{4+}$, $K_3GaF_6:Mn^{4+}$, $Zn_2AlF_7:Mn^{4+}$, $KIn_2F_7:Mn^{4+}$, $K_2SiF_6:Mn^{4+}$, $K_2TiF_6:Mn^{4+}$, $K_3ZrF_7:Mn^{4+}$, $Ba_{0.65}Zr_{0.35}F_{2.70}:Mn^{4+}$, $BaTiF_6:Mn^{4+}$, $K_2SnF_6:Mn^{4+}$, $Na_2TiF_6:Mn^{4+}$, $Na_2ZrF_6:Mn^{4+}$, $KRbTiF_6:Mn^{4+}$, or $K_2Si_{0.5}Ge_{0.5}F_6:Mn^{4+}$ are known (see, e.g., Japanese Patent Application prior-to-examination Publication (kohyo) No. 2009-528429).

SUMMARY OF THE INVENTION

The present embodiment provides a fluoride fluorescent material including a fluoride particle having a chemical composition represented by the formula (I):

$$A_2[M_{1-a}Mn^{4+}{}_aF_6] \quad (I)$$

wherein A is at least one cation selected from the group consisting of $K^+$, $Na^+$, $Rb^+$, $Cs^+$ and $NH_4^+$; M is at least one element selected from the group consisting of elements from Group 4 of the periodic table and elements from Group 14 of the periodic table; and variable a satisfies 0<a<0.2; and a thermally-conductive substance that has a higher thermal conductivity than the fluoride particle, and that is arranged on at least a portion of a surface of the fluoride particle, and a method for producing the fluoride fluorescent material.

The fluoride fluorescent material emits red-light and has superior durability.

Figure 1:
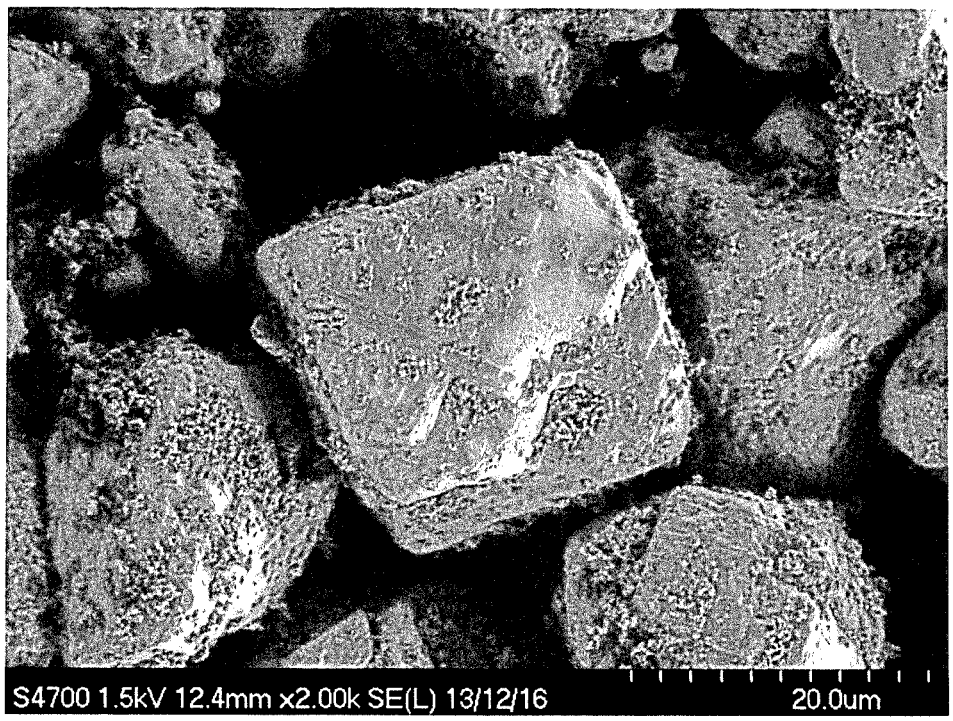
FIG. 1 is a scanning electron microscope (SEM) image of a fluoride fluorescent material according to Example 3.

DETAILED DESCRIPTION OF THE INVENTION $Mn^{4+}$ activated fluoride fluorescent materials that emit red-light having an emission peak with a narrow half-band width are desired to be widely put into practice. Such fluoride fluorescent materials, however, are required to be more durable for use in harsh environments, such as use for lighting. Fluoride fluorescent materials according to conventional techniques need to be improved in this durability.

To solve this problem, the present embodiment provides a red-light emitting fluorescent material having superior durability and a method for producing the fluorescent material.

Specific means to solve the problem are as follows, and the present invention involves the following embodiments.

A first mode of the present embodiment is a fluoride fluorescent material including a fluoride particle having a chemical composition represented by the formula (I):

$$A_2[M_{1-a}Mn^{4+}{}_aF_6] \quad (I)$$

wherein A is at least one cation selected from the group consisting of $K^+$, $Li^+$, $Na^+$, $Rb^+$, $Cs^+$ and $NH_4^+$; M is at least one element selected from the group consisting of elements from Group 4 of the periodic table and elements from Group 14 of the periodic table; and variable a satisfies 0<a<0.2; and a thermally-conductive substance having a higher thermal conductivity than the fluoride particle, and that is arranged on at least a portion of a surface of the fluoride particle.

A second mode of the present embodiment is a method for producing a fluoride fluorescent material including:

providing a fluoride particle having a chemical composition represented by the formula (I):

$$A_2[M_{1-a}Mn^{4+}_aF_6] \qquad (I)$$

wherein A is at least one cation selected from the group consisting of $K^+$, $Li^+$, $Na^+$, $Rb^+$, $Cs^+$ and $NH_4^+$; M is at least one element selected from the group consisting of elements from Group 4 of the periodic table and elements from Group 14 of the periodic table; and variable a denotes a number that satisfies $0<a<0.2$; and arranging a thermally-conductive substance having a higher thermal conductivity than the fluoride particle on at least a portion of a surface of the fluoride particle.

A third mode of the present embodiment is a method for producing a fluoride fluorescent material including:

a first step of contacting a first complex ion containing tetravalent manganese ion; and at least one cation selected from the group consisting of $K^+$, $Li^+$, $Na^+$, $Rb^+$, $Cs^+$ and $NH_4^+$; with a second complex ion containing at least one element selected from the group consisting of elements from Group 4 of the periodic table and elements from Group 14 of the periodic table in a liquid medium containing hydrogen fluoride to obtain a fluoride particle having a chemical composition represented by the formula (I):

$$A_2[M_{1-a}Mn^{4+}_aF_6] \qquad (I)$$

wherein A is at least one cation selected from the group consisting of $K^+$, $Li^+$, $Na^+$, $Rb^+$, $Cs^+$ and $NH_4^+$; M is at least one element selected from the group consisting of elements from Group 4 of the periodic table and elements from Group 14 of the periodic table; and variable a denotes a number that satisfies $0<a<0.2$;

a second step of contacting the resultant fluoride particle with a thermally-conductive substance having a higher thermal conductivity than the fluoride particle in a liquid medium to obtain fluoride particles having a thermally-conductive substance arranged on at least a portion of a surface thereof; and a third step of contacting the fluoride particle, on which the thermally-conductive substance is arranged, with at least the cation and the second complex ion in a liquid medium.

A fourth mode of the present embodiment is a light emitting device including the fluoride fluorescent material; and a light source that emits light having a wavelength in the range of from 380 to 485 nm.

The present embodiment provides a red-light emitting fluorescent material having superior durability and a method for producing the fluorescent material.

Hereinbelow, the fluoride fluorescent material, the method for producing the fluoride fluorescent material, and the light emitting device according to the present invention will be described in detail with reference to embodiments and examples. The embodiments described below are mere examples of the fluoride fluorescent material, the method for producing the fluoride fluorescent material, and the light emitting device of the preset embodiment for illustrating the technical concept of the present invention. The present invention is not limited to the fluoride fluorescent material, the method for producing the fluoride fluorescent material, and the light emitting device illustrated below. The relationship between the color names and the chromaticity coordinates, the relationship between the wavelength ranges of light and the color names of monochromatic light, and others are in accordance with JIS Z8110.

In the present specification, the term "step" means not only an independent step but also a step which cannot be clearly distinguished from the other steps but can achieve the desired object. Ranges of numerical values include the numerical values that appear before and after "to" or "-" as the minimum and the maximum values of the range. Further, for the amount of each component contained in the composition, when a plurality of compounds corresponding to the component exist, the amount of the component means the total amount of the compounds present in the composition unless otherwise specified.

<Fluoride Fluorescent Material>

The fluoride fluorescent material of the present embodiment includes:

a fluoride particle having a chemical composition represented by the formula (I):

$$A_2[M_{1-a}Mn^{4+}_aF_6] \qquad (I)$$

wherein A is at least one cation selected from the group consisting of $K^+$, $Li^+$, $Na^+$, $Rb^+$, $Cs^+$ and $NH_4^+$; M is at least one element selected from the group consisting of elements from Group 4 of the periodic table and elements from Group 14 of the periodic table; and variable a satisfies $0<a<0.2$; and a thermally-conductive substance having a higher thermal conductivity than the fluoride particle, and that is arranged on at least a portion of a surface of the fluoride particle.

A is also preferably selected from the group consisting of Li, Na, K, Rb and Cs and denotes at least one alkali metal element including at least one of Na and K.

Since thermally-conductive substances having a higher thermal conductivity than the fluoride fluorescent material are arranged on the surfaces of the fluoride fluorescent material, for example, heat dissipation from the fluoride fluorescent material is accelerated. This is believed to reduce performance degradation caused by the heat generated in the fluoride fluorescent material, and achieves superior durability.

The fluoride fluorescent material of the present embodiment is superior in durability. The durability of the fluoride fluorescent material can be evaluated by an accelerated test using, for example, laser light. Although the durability of the fluoride fluorescent material can also be evaluated by mounting it on a light emitting device and monitoring its product lifetime, such a method would require thousands to several tens of thousands of hours.

The durability of a fluoride fluorescent material may be evaluated using laser light through the following example procedure.

A semiconductor laser that emits light with a wavelength of 450 nm is prepared, and its temperature is adjusted to stabilize the light output. About 0.34 g of a fluoride fluorescent material is placed in a cell for measuring powder brightness. The light output from the semiconductor laser is illuminated on the fluoride fluorescent material in the cell. At this time, the current impressed on the semiconductor laser is adjusted so as to have a light density of 3.5 $W/cm^2$. The light from the portion on which the laser light is illuminated is collected by a photomultiplier tube to measure changes in powder brightness. It is preferred that laser light reflected by the fluorescent material be removed using an optical filter to avoid its influence on the power brightness.

Fluoride Particles

The fluoride particles having a chemical composition represented by the formula (I) that constitute the fluoride fluorescent material of the present embodiment (hereinafter, this may be simply referred to as "fluoride particles") themselves function as a fluorescent material. The fluoride fluorescent material of the present embodiment has improved durability without losing the function as a fluorescent material of fluoride particles having a chemical composition represented by the formula (I).

Although the particle size and the particle size distribution of the fluoride particles are not particularly limited, the particles preferably have a single-peak particle size distribution, and more preferably a single-peak particle size distribution with a narrow distribution width to achieve desirable emission intensity and durability. The surface area and the bulk density of the fluoride are not particularly limited.

For the particle size, the fluoride particles have, for example, a volume average particle size of 1 to 100 μm, and preferably 5 to 70 μm.

The fluoride particles are each an $Mn^{4+}$-activated fluorescent material, and can emit red-light by absorbing light in the short wavelength region of visible light. The excitation light, which is light in the short wavelength region of visible light, preferably is light mainly in the blue color region. Specifically, the excitation light preferably has an intensity spectrum with a main peak wavelength in the range of 380 nm to 500 nm, more preferably in the range of 380 nm to 485 nm, still more preferably in the range of 400 nm to 485 nm, and most preferably in the range of 440 nm to 480 nm.

The emission wavelength of the fluoride particles have a longer wavelength than excitation light and is not particularly limited as long as it is red. The emission spectrum of the fluoride particles preferably has a peak wavelength in the range of 610 nm to 650 nm. The half band width of the emission spectrum is preferably narrow, and is specifically 10 nm or less.

A in formula (I) is at least one cation selected from the group consisting of lithium ion ($Li^+$), sodium ion ($Na^+$), potassium ion ($K^+$), rubidium ion ($Rb^+$), cesium ion ($Cs^+$) and ammonium ion ($NH_4^+$). Of these, A is preferably one cation selected from the group consisting of $Li^+$, $Na^+$, $K^+$, $Rb^+$ and $Cs^+$, and include at least one of $Na^+$ and $K^+$. A is also preferably at least a cation selected from the group consisting of $Li^+$, $Na^+$, $K^+$, $Rb^+$, $Cs^+$ and $NH_4^+$, and is preferably a cation including at least $K^+$, and more preferably a cation of, for example, an alkali metal having $K^+$ as a main component. The phrase "having $K^+$ as a main component" means that the content of $K^+$ in A in general formula (I) is 80% by mol or more, preferably 90% by mol or more, and more preferably 95% by mol or more.

M in formula (I) is at least one element selected from the group consisting of elements from Group 4 of the periodic table and elements from Group 14 of the periodic table. M is preferably at least one selected from the group consisting of titanium (Ti), zirconium (Zr), hafnium (Hf), silicon (Si), germanium (Ge) and tin (Sn), more preferably M contains silicon (Si), or silicon (Si) and germanium(Ge), and still more preferably M contains silicon (Si), or silicon (Si) and germanium (Ge) to achieve desirable light-emitting properties.

If M contains silicon (Si), or silicon (Si) and germanium (Ge), a part of the at least one of Si and Ge may be replaced by at least one selected from the group consisting of elements belonging to Group 4 of the periodic table including Ti, Zr, and Hf, and elements belonging to Group 14 of the periodic table including C and Sn.

Thermally-conductive substance

In the fluoride fluorescent material, at least one thermally-conductive substance having a higher thermal conductivity than the fluoride particles is arranged on a surface of the respective fluoride particles. The thermally-conductive substance may be arranged on a partial region of the surface or on the entire surface. The thermally-conductive substance is not particularly limited as long as the substance has a higher thermal conductivity than the fluoride particles, and can be suitably selected from known substances. To achieve improved durability of the fluoride fluorescent material, the thermally-conductive substance having a higher thermal conductivity than the fluoride particles is preferably at least one selected from the group consisting of aluminum oxide, titanium oxide, beryllium oxide, zinc oxide, yttrium oxide, magnesium carbonate, diamond, boron nitride, aluminum nitride, rare-earth aluminate and metal oxynitride. An example of the metal oxynitride is $Si_3N_4$—$Al_2O_3$.

The thermally-conductive substance preferably has a small difference between its refractive index and the refractive index of the fluoride particle. More preferably, the ratio of the refractive index of the fluoride particle to the refractive index of the thermally-conductive substance (fluoride particle/thermally-conductive substance) is 0.5 to 1.3. This is likely to further reduce lowering of energy efficiency of the fluoride fluorescent material.

The thermally-conductive substances are considered to be arranged on the surfaces of the fluoride particles by, for example, electrical attraction, or Van der Waals force. The shape of the thermally-conductive substance arranged on the surfaces of fluoride particles is not particularly limited, and may be in the form of a film or a particle. When the thermally-conductive substance is in the form of a film, the thermally-conductive substance may be attached, for example, like a film or membrane to a partial region on the surfaces of the fluoride particle. The thermally-conductive substance has a thickness of, for example, 50 nm to 10 μm.

When the thermally-conductive substance is in the form of a particle, the particle size is not particularly limited, and can be suitably selected depending on, for example, the size of the fluoride particle. Such thermally-conductive substance has a particle size or a volume average particle size of 5 nm to 10 μm, and preferably 10 nm to 1 μm.

The particle size ratio of particles of thermally-conductive substance to the fluoride particles is, for example, 0.0002 to 0.4, and is preferably 0.0004 to 0.04.

Figure 2:
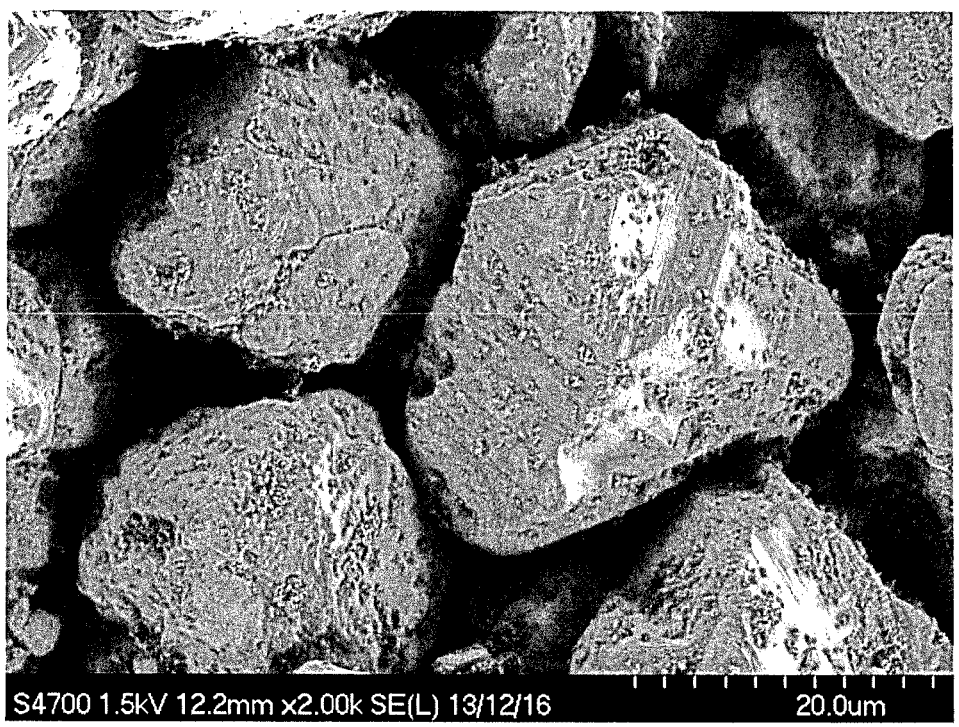
FIG. 2 is an SEM image of a fluoride fluorescent material according to Example 5.
Figure 3:
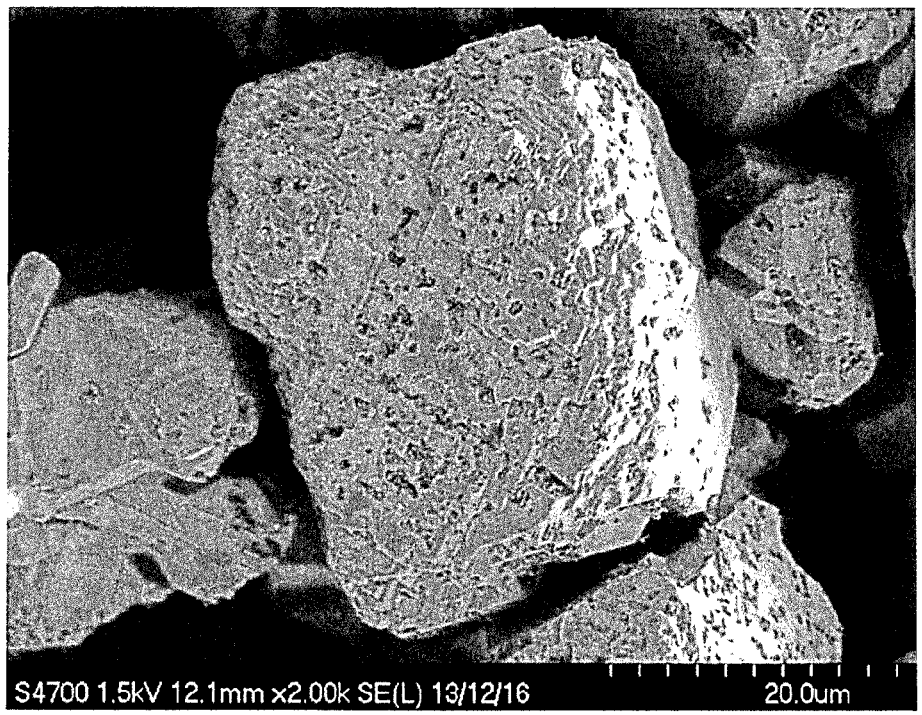
FIG. 3 is an SEM image of a fluoride fluorescent material according to Example 6.
Figure 4:
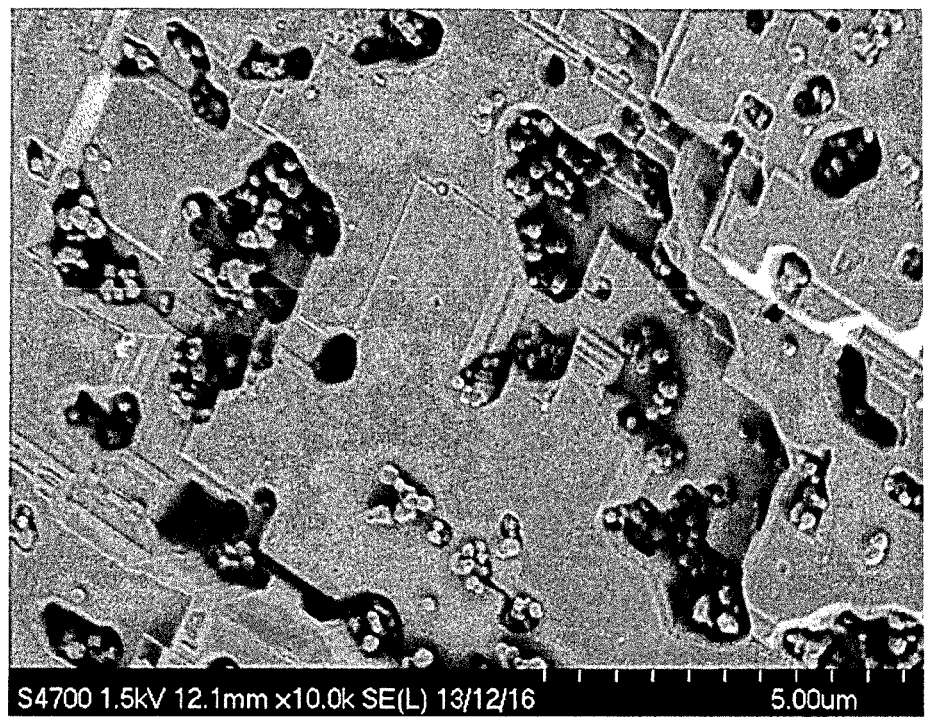
FIG. 4 is an SEM image of a fluoride fluorescent material according to Example 6.

How the thermally-conductive substances should be arranged on the surfaces of the fluoride particles, is not particularly limited as long as the thermally-conductive substances and the fluoride particles are in contact with one another. As shown in FIGS. 1 and 2, for example, each particles of thermally-conductive substsance may be in contact with a fluoride particle on its one surface alone, or as shown in FIGS. 3 and 4, each particles of thermally-conductive substsance may be partially surrounded by the fluoride crystals, with the thermally-conductive substance being in contact with the fluoride crystals on their multiple surfaces. Alternatively, the particles of the thermally-conductive substance may be partially embedded in the surface of a fluoride particle, with the remaining portions being exposed.

The amount of the thermally-conductive substance contained in the fluoride fluorescent material can be suitably selected depending on, for example, the type of the thermally-conductive substance. The content is, for example, 0.1 to 20% by weight based on the weight of the fluoride particles, and is preferably 0.5 to 20% by weight, more preferably 1 to 20% by weight, and still more preferably 1 to 10%.

The fluoride fluorescent material preferably satisfies at least one of the following aspects, and more preferably satisfies all the aspects:
(1) A in formula (I) is at least one alkali metal including potassium (K).
(2) M in formula (I) includes silicon (Si), or silicon (Si) and germanium (Ge).
(3) The thermally-conductive substance is at least one selected from the group consisting of aluminum oxide, titanium oxide, beryllium oxide, zinc oxide, yttrium oxide, magnesium carbonate, diamond, boron nitride, aluminum nitride, rare-earth aluminate and metal oxynitride.
(4) The thermally-conductive substance is in the form of a particle having a volume average particle size of 5 nm to 10 μm.
(5) The content of the thermally-conductive substance is 0.1 to 20% by weight based on the weight of the fluoride particle.

<Method for Producing the Fluoride Fluorescent Material>

A first mode of the method for producing the fluoride fluorescent material according to the present embodiment includes the steps of:
providing fluoride particles having a chemical composition represented by the formula (I):

$$A_2[M_{1-a}Mn^{4+}{}_aF_6] \quad (I)$$

wherein A is at least one cation selected from the group consisting of $K^+$, $Li^+$, $Na^+$, $Rb^+$, $Cs^+$ and $NH_4^+$; M is at least one element selected from the group consisting of elements from Group 4 of the periodic table and elements from Group 14 of the periodic table; and variable a denotes a number that satisfies $0<a<0.2$; and
arranging a thermally-conductive substance having a higher thermal conductivity than the fluoride particles on at least a portion of a surface of the fluoride particles.

A is also preferably selected from the group consisting of Li, Na, K, Rb and Cs and denotes at least one alkali metal element including at least one of Na and K.

The at least one cation selected from the group consisting of $K^+$, $Li^+$, $Na^+$, $Rb^+$, $Cs^+$ and $NH_4^+$ in the first mode of the production method is preferably selected from the group consisting of $Li^+$, $Na^+$, $K^+$, $Rb^+$ and $Cs^+$ and is at least one alkali metal ion including at least one of $Na^+$ and $K^+$.

[Providing Fluoride Particles]

The step of providing fluoride particles may include the step of selecting commercially available fluoride particles having the desired chemical composition, or the step of preparing fluoride particles having the desired chemical composition. The step of providing fluoride particles preferably includes the step of preparing fluoride particles.

The fluoride particles having a chemical composition represented by the formula (I) may be prepared, for example, by contacting a first complex ion containing a tetravalent manganese ion, at least one cation selected from the group consisting of $K^+$, $Li^+$, $Na^+$, $Rb^+$, $Cs^+$ and $NH_4^+$, and a second complex ion containing at least one element selected from the group consisting of elements from Group 4 of the periodic table and elements from Group 14 of the periodic table in a liquid medium containing hydrogen fluoride.

The method of contacting the first complex ions, cations such as alkali metal ions, and the second complex ions are not particularly limited as long as fluoride particles having the desired chemical composition are obtained. The method for preparing fluoride particles is, preferably, for example, a first process of mixing two solutions, or a second process of mixing three solutions as described below.

First Preparation Process

The first process for preparing fluoride particles having a chemical composition represented by the formula (I) may include the step of mixing, for example, a solution A containing at least hydrogen fluoride and a first complex ion containing a tetravalent manganese, and a second complex ion containing at least one element selected from the group consisting of elements from Group 4 of the periodic table and elements from Group 14 of the periodic table and a fluorine ion; with a solution B containing at least one cation and hydrogen fluoride.

Solution A

Solution A is a hydrofluoric acid solution containing a first complex ion including a tetravalent manganese, and a second complex ion including a fluorine ion and at least one element selected from the group consisting of elements from Groups 4 of the periodic table and elements from Group 14 of the periodic table.

The manganese source that constitutes a first complex ion that contains a tetravalent manganese is not particularly limited as long as it is a compound containing manganese. Specific examples of the manganese source capable of forming solution A include $K_2MnF_6$, $KMnO_4$, and $K_2MnCl_6$. In particular, $K_2MnF_6$ is preferable, mainly because it can stably present in hydrofluoric acid in the form of $MnF_6$ complex ions while maintaining oxidation number (tetravalent) to be activated. Of these, the manganese sources containing an alkali metal such as potassium can also serve as a part of the alkali metal source to be contained in solution B. The manganese sources for the first complex ions may be used alone or in combination.

The concentration of the manganese source in solution A is not particularly limited. The lower limit of the concentration of the manganese source in solution A is usually 0.01% by weight or more, preferably 0.03% by weight or more, and more preferably 0.05% by weight or more. The upper limit of the concentration of the manganese source in solution A is usually 50% by weight or less, preferably 40% by weight or less, and more preferably 30% by weight or less.

The second complex ions preferably contain at least one element selected from the group consisting of titanium (Ti), zirconium (Zr), hafnium (Hf), silicon (Si), germanium (Ge) and tin (Sn), and more preferably contain silicon (Si), or silicon (Si) and germanium (Ge), and, still more preferably, the second complex ions are silicon fluoride complex ions.

When, for example, the second complex ions contain silicon (Si), the source of the second complex ions is preferably a compound that contains silicon and fluorine and is highly soluble in the solution. Specific examples of the source of the second complex ions includes $H_2SiF_6$, $Na_2SiF_6$, $(NH_4)_2SiF_6$, $Rb_2SiF_6$, and $Cs_2SiF_6$. Of these, $H_2SiF_6$ is preferable, because it is highly soluble in water and contains no alkali metal element as an impurity. The sources of the second complex ions may be used alone or in combination.

The lower limit of the concentration of the source of the second complex ions in solution A is usually 5% by weight or more, preferably 10% by weight or more, and more preferably 15% by weight or more. The upper limit of the concentration of the source of the second complex ions in solution A is usually 80% by weight or less, preferably 70% by weight or less, and more preferably 60% by weight or less.

The lower limit of the concentration of hydrogen fluoride in solution A is usually 20% by weight or more, preferably 25% by weight or more, and more preferably 30% by weight or more. The upper limit of the concentration of hydrogen fluoride in solution A is usually 80% by weight or less, preferably 75% by weight or less, and more preferably 70% by weight or less.

Solution B

Solution B contains at least cations, such as alkali metal ions, and hydrogen fluoride, and may contain additional components as necessary. Solution B is obtained as an aqueous hydrofluoric acid solution containing, for example, alkali metal ions such as potassium ions. Specific examples of the potassium source capable of constituting solution B includes water-soluble potassium salts such as KF, $KHF_2$, KOH, KCl, KBr, KI, potassium acetate, and $K_2CO_3$. Of these, $KHF_2$ is preferable, because it is soluble in the solution without reducing the concentration of hydrogen fluoride, and it has a low heat of dissolution and is highly safe. In addition to potassium source, examples of the cation source such as alkali metal include $NaHF_2$, $Rb_2CO_3$, and $Cs_2CO_3$. Such cation sources like alkali metal for constituting solution B may be used alone or in combination.

The lower limit of the concentration of hydrogen fluoride in solution B is usually 20% by weight or more, preferably 25% by weight or more, and more preferably 30% by weight or more. The upper limit of the concentration of hydrogen fluoride in solution B is usually 80% by weight or less, preferably 75% by weight or less, and more preferably 70% by weight or less.

The lower limit of the concentration of a cation source such as alkali metal in solution B is usually 5% by weight or more, preferably 10% by weight or more, and more preferably 15% by weight or more. The upper limit of the concentration of alkali metal source in solution B is usually 80% by weight or less, preferably 70% by weight or less, and more preferably 60% by weight or less.

The method of mixing solutions A and B is not particularly limited. Solution A may be added while stirring solution B, or solution B may be added while stirring solution A. Alternatively, solutions A and B each may be charged into a container and mixed by stirring.

Mixing solution A with solution B allows the first complex ions, cations like alkali metal ions, such as potassium ions, and the second complex ions to react in predetermined proportions to precipitate as crystals, or fluoride particles, having the desired chemical composition represented by formula (I). The precipitated fluoride particles can be collected by solid-liquid separation through filtration or the like. The particles may be washed with a solvent such as ethanol, isopropyl alcohol, water, and acetone. The particles may be then dried usually at 50° C. or more, preferably at 55° C. or more, and more preferably at 60° C. or more, and usually at 150° C. or less, preferably at 120° C. or less, and more preferably at 110° C. or less. The drying time is not particularly limited as long as water attached to the fluoride particles is vaporized, and it is 10 hours, for example.

When mixing solution A with solution B, it is preferable to suitably adjust the mixing ratio so as to obtain a product, or fluoride particles, having the intended chemical composition, considering the difference between the initial composition of solution A and solution B and the chemical composition of the resultant fluoride particles.

The temperature at the time of mixing solution A with solution B in the first preparation process is not particularly limited as long as the desired fluoride particles are obtained. The temperature at the time of mixing solution A with solution B may be 5 to 40° C., for example.

Second Preparation Process

The second process for preparing fluoride particles having a chemical composition represented by the formula (I) may include the steps of mixing: a first solution containing at least the a first complex ion containing a tetravalent manganese ion and hydrogen fluoride, a second solution containing at least one cation such as an alkali metal ion and hydrogen fluoride, and a third solution containing at least a second complex ion containing at least combination of a fluorine ion and an element selected from the group consisting of elements from Group 4 of the periodic table and elements from Group 14 of the periodic table.

Mixing the first, second, and third solutions readily results in fluoride particles that have the desired composition as well as the desired particle size and particle size distribution at high productivity.

First Solution

The first solution includes at least first complex ions containing tetravalent manganese ions and hydrogen fluoride, and may include additional components as necessary. The first solution may be obtained as, for example, an aqueous hydrofluoric acid solution containing a manganese source. The manganese source is not particularly limited as long as it is a compound containing manganese. Specific examples of manganese sources capable of constituting a first solution include $K_2MnF_6$, $KMnO_4$, and $K_2MnCl_6$. Of these, $K_2MnF_6$ is preferable, mainly because it forms $MnF_6$ complex ions in hydrofluoric acid, which are stable in hydrofluoric acid while maintaining oxidation number (tetravalent) to be activated. Of these, the manganese sources containing an alkali metal such as potassium can also serve as a part of the source of cations such as alkali metal cations in the second solution. The manganese sources constituting the first solution may be used alone or in combination.

The lower limit of the concentration of hydrogen fluoride in the first solution is usually 20% by weight or more, preferably 25% by weight or more, and more preferably 30% by weight or more. The upper limit of the concentration of hydrogen fluoride in the first solution is usually 80% by weight or less, preferably 75% by weight or less, and more preferably 70% by weight or less. When the hydrogen fluoride concentration is 30% by weight or more, the manganese source (e.g., $K_2MnF_6$) constituting the first solution is more stable to hydrolysis, and the concentration of the tetravalent manganese in the first solution varies (fluctuates) less. This would facilitates control of the amount of the manganese for activation in the obtained fluoride fluorescent material, and thereby reduces variation (fluctuation) in the light emission efficiency of the fluoride fluorescent material. When the hydrogen fluoride concentration is 70% by weight or less, decreases in the boiling point of the first solution is prevented or reduced, so that the generation of hydrogen fluoride gas is prevented or reduced. This facilitates control of the hydrogen fluoride concentration in the first solution, and effectively reduces variation (fluctuation) in the particle diameter of the resultant fluoride fluorescent material.

The concentration of the manganese source in the first solution is not particularly limited. The lower limit of the concentration of the manganese source in the first solution is usually 0.01% by weight or more, preferably 0.03% by weight or more, and more preferably 0.05% by weight or more. The upper limit of the concentration of the manganese source in the first solution is usually 50% by weight or less, preferably 40% by weight or less, and more preferably 30% by weight or less.

Second Solution

The second solution contains hydrogen fluoride and at least one cation selected from alkali metal ions and the like, and may contain additional components as necessary. The second solution is obtained, for example, as an aqueous hydrofluoric acid solution that contains alkali metal ions such as potassium ions. Specific examples of potassium sources containing potassium ions that can constitute the second solution include water soluble potassium salts such as KF, $KHF_2$, KOH, KCl, KBr, KI, potassium acetate, and $K_2CO_3$. Of these, $KHF_2$ is preferable, because it is soluble in the solution without lowering the concentration of hydrogen fluoride, and it has a low heat of dissolution and is highly safe. Besides potassium sources, examples of the sources of cations such as alkali metal include $NaHF_2$, $Rb_2CO_3$, and $Cs_2CO_3$. The sources of cations, such as alkali metal cations, constituting the second solution may be used alone or in combination.

The lower limit of the concentration of hydrogen fluoride in the second solution is usually 20% by weight or more, preferably 25% by weight or more, and more preferably 30% by weight or more. The upper limit of the concentration of hydrogen fluoride in the second solution is usually 80% by weight or less, preferably 75% by weight or less, and more preferably 70% by weight or less.

The lower limit of the concentration of the source of cations such as alkali metal cations in the second solution is usually 5% by weight or more, preferably 10% by weight or more, and more preferably 15% by weight or more. The upper limit of the concentration of alkali metal source in the second solution is usually 80% by weight or less, preferably 70% by weight or less, and more preferably 60% by weight or less.

Third Solution

The third solution contains at least the second complex ions containing fluorine ions and an element selected from the group consisting of elements from Group 4 of the periodic table and elements from Group 14 of the periodic table, and may contain additional components as necessary. The third solution can be obtained, for example, as an aqueous solution containing the second complex ions.

The second complex ions preferably contain at least one selected from the group consisting of titanium (Ti), zirconium (Zr), hafnium (Hf), silicon (Si), germanium (Ge) and tin (Sn), more preferably contain silicon (Si), or silicon (Si) and germanium (Ge), and, still more preferably, are silicon fluoride complex ions.

When, for example, the second complex ions contain silicon (Si), the source of the second complex ions preferably is a compound that contains silicon and fluorine and is highly soluble in the solution. Specific examples of such sources of the second complex ions include $H_2SiF_6$, $Na_2SiF_6$, $(NH_4)_2SiF_6$, $Rb_2SiF_6$, and $Cs_2SiF_6$. Of these, $H_2SiF_6$ is preferable, because it is highly soluble in water and contains no alkali metal element as an impurity. The sources of the second complex ions constituting the third solution may be used alone or in combination.

The lower limit of the concentration of the source of the second complex ions in the third solution is usually 5% by weight or more, preferably 10% by weight or more, and more preferably 15% by weight or more. The upper limit of the concentration of the source of the second complex ions in the third solution is usually 80% by weight or less, preferably 70% by weight or less, and more preferably 60% by weight or less.

The method of mixing the first, second and third solutions is not particularly limited. The second and third solutions may be added while stirring the first solution, or the first and third solutions may be added while stirring the second solution, or the first and second solutions may be added while stirring the third solution. Alternatively, the first solution, the second solution and the third solution each may be charged into a container and mixed by stirring.

Mixing the first, second and third solutions allows the first complex ions, cations such as alkali metal ions, and the second complex ions to react in predetermined proportions to precipitate crystals, or fluoride particles, having the desired chemical composition represented by formula (I). The precipitated fluoride particles can be collected by solid-liquid separation through filtration or the like. The particles may be washed with a solvent such as ethanol, isopropyl alcohol, water, and acetone. The particles may further be dried, usually at 50° C. or more, preferably at 55° C. or more, and more preferably at 60° C. or more, and usually at 150° C. or less, preferably at 120° C. or less, and more preferably at 110° C. or less. The drying time is not particularly limited as long as water attached to the fluoride particles is vaporized, and is 10 hours, for example.

When mixing the first, second and third solutions, it is preferable to suitably adjust the mixing ratio so as to obtain a product, or fluoride particles, having the intended chemical composition, considering the difference between the initial composition of the first, second and third solutions, and the chemical composition of the resultant fluoride particles.

The temperature at the time of mixing the first, second and third solutions in the second preparation process is not particularly limited as long as the desired fluoride particles are obtained. The temperature at the time of mixing the first, second and third solutions may be, 5 to 40° C., for example.

The step of supplying fluoride particles preferably further includes dispersing and particle-sizing the fluoride particles, and it is more preferable that the fluoride particles prepared by the above-mentioned process undergo dispersing and particle-sizing treatments. A fluoride fluorescent material with superior durability can be obtained by subjecting the fluoride particles that underwent dispersing and particle-sizing treatments to the step of arranging a thermally-conductive substance thereon.

Either one of the dispersing and particle-sizing treatments may be conducted alone, or both may be conducted.

The method for dispersing fluoride particles is not particularly limited, and may be suitably selected from common distribution means. Examples of the dispersion means include ball mills and ultrasonic dispersion devices. The dispersing treatment is preferably performed using a wet ball mill. This minimizes the damage to the fluoride particles and effectively mitigates lowering of their light-emitting properties.

The method of particle-sizing fluoride particles is not particularly limited, and may be suitably selected from common particle-sizing means. Examples of the particle-sizing means include means using a cyclone and means using a sieve. The particle-sizing treatment is preferably performed using a wet sieve. This minimizes the damage to fluoride particles, and effectively mitigates lowering of the light-emitting properties.

[Arranging Thermally-conductive Substance]

The step of arranging thermally-conductive substances is not particularly limited as long as a fluoride fluorescent material is obtained in which the fluoride particles remain in contact with thermally-conductive substances on a surface of the respective fluoride particles. The step of arranging thermally-conductive substances, for example, preferably employs at least one method selected from the group consisting of powder dry mixing, coagulation-sedimentation, spray drying, chemical vapor deposition and sol-gel methods.

The powder dry mixing method is a method of mixing the fluoride particles with the particles of thermally-conductive substances as they are both powdered. Mixing means include, for example, a method using a pot rolling.

When arranging thermally-conductive substances on surfaces of the fluoride particles using the powder dry mixing method, the content of the thermally-conductive substances used in the method can be suitably selected so that the desired content of the thermally-conductive substances is achieved. The content is, for example, 0.1 to 20% by weight based on the weight of the fluoride particles, preferably 0.5 to 20% by weight, and more preferably 1 to 20% by weight, and is still more preferably 1 to 10% by weight.

The coagulation-sedimentation method may include, for example, preparing a mixture by mixing fluoride particles and the thermally-conductive substances in a liquid medium; leaving the resultant mixture to stand to allow sedimentation of aggregates composed of the fluoride particles and the thermally-conductive substances; and separating the aggregates by solid-liquid separation.

The liquid medium used in the coagulation-sedimentation is not particularly limited as long as aggregates composed of the fluoride particles and the thermally-conductive substances are obtained. Examples of the liquid medium include aqueous hydrogen peroxide and alcohols such as ethanol. The content of the liquid medium is such that the content of the fluoride particles is, for example, 1 to 60% by weight, and preferably 5 to 40% by weight in the liquid medium.

The amount of the thermally-conductive substances used in the coagulation-sedimentation can be suitably selected so as to achieve the desired content of the thermally-conductive substances. The content is, for example, 0.1 to 20% by weight, preferably 0.5 to 20% by weight, more preferably 1 to 20% by weight, and still more preferably 1 to 10% by weight based on the weight of the fluoride particles.

The mixing method is not particularly limited, and can be suitably selected from the common mixing means. The temperature at the time of mixing is not particularly limited, and may be 5 to 40° C., for example.

The method of solid-liquid separating the aggregates is not particularly limited as long as the aggregates are separated from the liquid medium, and can be suitably selected from the common solid-liquid separation means. Examples of the solid-liquid separation means include, filtration, centrifugal separation, and solvent evaporation methods. The aggregates that underwent solid-liquid separation may be suitably subjected to treatments such as washing.

The spray drying method is a method of spray-micronizing a mixture of the fluoride particles, the thermally-conductive substances, and a liquid medium, whereby increasing the surface area per unit of the droplets of the mixture, and contacting them with hot air to instantly dry them so as to obtain particles of the fluoride fluorescent material as aggregates of the fluoride particles and the thermally-conductive substances.

The liquid medium for use in the spray drying method is not particularly limited as long as aggregates of the fluoride particles and the thermally-conductive substances are produced. Examples of the liquid medium include aqueous hydrogen peroxide and alcohols such as ethanol. The amount of the liquid medium used is such that the content of the fluoride particles is, for example, 1 to 60% by weight, and preferably 5 to 40% by weight in the liquid medium.

The amount of the thermally-conductive substances used in the spray drying method can be suitably selected so that the desired content of the thermally-conductive substances is achieved. The content is, for example, 0.1 to 20% by weight, preferably 0.5 to 20% by weight, more preferably 1 to 20% by weight, and still more preferably 1 to 10% by weight based on the weight of the fluoride particles.

The chemical vapor deposition method is a method of gasifying raw materials of the thermally-conductive substances, and causing them to react on the surfaces of the fluoride particles, thereby to arrange the thermally conductive substances on the surfaces of the fluoride particles.

If the thermally-conductive substance is a metal nitride material, an example of the chemical vapor deposition (CVD) method is a method to form aluminum nitride by CVD in a manner as described in U.S. Pat. No. 6,064,150, thereby to arrange the thermally-conductive substance on the surfaces of the fluoride particles.

Such thermally-conductive substances including a metal nitride material (e.g., metal nitride such as aluminum nitride or metal oxynitride such as aluminum oxynitride) can also be formed in a fluid bed furnace using the CVD method. In addition to this, such thermally-conductive substances including a metal nitride material can be formed using metal alkyls, such as alkylsilane, and nitrogen compounds, such as ammonia.

The sol-gel method is a method of synthesizing thermally-conductive substances on the surfaces of the fluoride particles through solation and gelation of a solution of a compound capable of forming a thermally-conductive substance.

For example, metal alkoxide, as a starting material, is dissolved in an alcohol solvent such as ethanol. In this solution, aqueous hydrogen peroxide and fluoride particles are mixed, and to this mixture, dilute hydrogen fluoride water is slowly added with stirring. By leaving the resultant mixture to stand at room temperature for one day, for example, fluoride particles to which film-like thermally-conductive substances are attached can be obtained. The obtained fluoride particles to which thermally-conductive substances are attached may further undergo heating to reinforce the attached substances and to eliminate impurities.

Where particles of thermally-conductive substances are used in the step of arranging a thermally-conductive substances, the thermally-conductive substances are preferably in a dispersed state. By using dispersed thermally conductive substances, the resultant fluoride fluorescent material is likely to have further improved durability. This is probably because, as a result of dispersion, the thermally-conductive substances have larger surface areas, and this facilitates heat dissipation from the fluoride fluorescent material on which the thermally-conductive substances are arranged.

The method of dispersing the thermally-conductive substance is not particularly limited, and can be suitably selected from common dispersing means. For example, the mixture of the thermally-conductive substances and the liquid medium can be dispersed using a dispersing device such as roll mills and ultrasonic dispersion devices.

The dispersing conditions can be suitably selected depending on the type of the thermally-conductive substance.

The method for producing the fluoride fluorescent material may further include the step of dispersing and particle-sizing the resultant fluoride fluorescent material subsequent to the step of arranging the thermally-conductive substances. The details for dispersing and particle-sizing the fluoride fluorescent material are the same as the already-described dispersing and particle-sizing treatments of the fluoride particles.

The second mode of the method for producing a fluoride fluorescent material of the present embodiment includes the first step of contacting a first complex ion containing a tetravalent manganese ion, at least one cation selected from the group consisting of $K^+$, $Li^+$, $Na^+$, $Rb^+$, $Cs^+$ and $NH_4^+$, and a second complex ion containing at least one element selected from the group consisting of elements from Group 4 of the periodic table and elements from Group 14 of the periodic table in a liquid medium containing hydrogen fluoride to obtain a fluoride particle having a chemical composition represented by the formula (I); the second step of contacting the resultant fluoride particle with a thermally-conductive substance having a higher thermal conductivity than the fluoride particle in a liquid medium to obtain a fluoride particle having a thermally-conductive substance on a surface thereof; and the third step of contacting the fluoride particle on which the thermally-conductive substance is arranged with at least combination of the cation and the second complex ion in a liquid medium.

In the second mode of the production process, the at least one cation selected from the group consisting of $K^+$, $Li^+$, $Na^+$, $Rb^+$, $Cs^+$ and $NH_4^+$, is preferably selected from the group consisting of $Li^+$, $Na^+$, $K^+$, $Rb^+$ and $Cs^+$ and is at least one alkali metal ion including at least one of $Na^+$ and $K^+$.

Contacting fluoride particles having thermally-conductive substances arranged on surfaces thereof with at least combination of cations such as alkali metal ions and the second complex ions in a liquid medium allows fluoride crystals, which have the chemical composition represented by formula (I) or the chemical composition represented by formula (I) in which a is 0, to precipitate on the surfaces of the fluoride particles. As a result, as shown in FIGS. 3 and 4, for example, the fluoride crystals grow around the thermally-conductive substances, causing the thermally-conductive substances each to be at least partially surrounded by fluoride crystals. In other words, the fluoride particles are in contact with the thermally-conductive substances on multiple surfaces. Because of this, for example, the area of contact between the thermally-conductive substances and the fluoride particles increases, and the heat dissipation efficiency of the fluoride fluorescent material further increases, leading to further improved durability. In addition, the particles of thermally-conductive substances are likely not to come off from the fluoride particles.

In the first step, the first complex ions, cations such as alkali metal ions, and the second complex ions are contacted in a liquid medium containing hydrogen fluoride to yield fluoride particles having a chemical composition represented by formula (I). A favorable mode of the first step includes the first and second processes for preparing fluoride particles in the first mode of the method for producing the fluoride fluorescent material.

That is, the first step preferably includes the first preparation process of mixing a solution A containing the first complex ions, the second complex ions containing at least one element selected from the group consisting of elements from Group 4 of the periodic table and elements from Group 14 of the periodic table and fluorine ions, and hydrogen fluoride, with a solution B containing at least hydrogen fluoride and the cations The first step also preferably includes the second preparation process of mixing a first solution containing at least combination of the first complex ions and hydrogen fluoride, and a second solution containing at least combination of cations such as alkali metal ions and hydrogen fluoride, with a third solution containing at least combination of fluorine ion and the second complex ions containing at least an element selected from the group consisting of elements from Group 4 of the periodic table and elements from Group 14 of the periodic table.

The details of the first and second preparation processes for obtaining fluoride particles in the second mode of the method for producing the fluoride fluorescent material are the same as those for the first mode.

The first step preferably further includes the step of dispersing and particle-sizing the resultant fluoride particles. Including this step is likely to further improve durability of the resultant fluoride fluorescent material. The details of dispersing and particle-sizing treatments of fluoride particles are the same as those for the first mode.

In the second step, the fluoride particles obtained in the first step are contacted with a thermally-conductive substances having a higher thermal conductivity than the fluoride particles in a liquid medium to obtain fluoride particles each having a thermally-conductive substances arranged on a surface thereof.

The second step can include, for example, mixing fluoride particles with the thermally-conductive substances in a liquid medium. Mixing fluoride particles with the thermally-conductive substances in a liquid medium results in aggregates in which thermally-conductive substances are arranged on the surfaces of the fluoride particles. The mixing method is not particularly limited, and can be suitably selected from common mixing means.

The liquid medium to be used in the second step is not particularly limited as long as aggregates in which thermally-conductive substances are arranged on the surfaces of the fluoride particles are obtained. Examples of the liquid medium include aqueous hydrogen peroxide, alcohols such as ethanol, and hydrofluoric acid. The amount of the liquid medium is, for example, such that the content of the fluoride particles in the liquid medium is 1 to 60% by weight, preferably 5 to 40% by weight.

The amount of the thermally-conductive substance to be used in the second step can be suitably selected so that the desired content of the thermally-conductive substance is obtained. The content is, for example, 0.1 to 20% by weight, preferably 0.5 to 20% by weight, more preferably 1 to 20% by weight, and still more preferably 1 to 10% by weight based on the weight of the fluoride particles.

The second step may be performed, after solid-liquid separation of the fluoride particles obtained in the first step, by adding the fluoride particles again to a liquid medium, or the second step may be performed in the liquid medium used in the first step without performing solid-liquid separation of the fluoride particles.

The temperature of the liquid medium in the second step is not particularly limited, and may be 5 to 40° C., for example.

In the third step, the fluoride particles with the thermally-conductive substances arranged thereon, which are formed in the second step, are contacted with at least combination of cations such as alkali metal ions and the second complex ions in a liquid medium. Although, in the third step, at least combination of cations such as alkali metal ions and the second complex ions are contacted with the fluoride particles, the first complex ions may also be contacted together, if necessary. Fluoride crystals thereby form on surfaces of the fluoride particles having the chemical composition represented by formula (I) or the chemical composition represented by formula (I) in which a is 0.

As the solution to be used in the third step that contains cations such as alkali metal ions, the second complex ions, and optionally the first complex ions, the same solution used in the first step, for example, may be used. The preferable solution is the same as described above.

The temperature of the liquid medium used in the third step is not particularly limited, and may be 5 to 40° C., for example.

The amounts of cations such as alkali metal ions, the second complex ions, and, optionally, the first complex ions to be used in the third step is such that the total weight of the fluoride particles increases, for example, by 1 to 50% by weight, and preferably by 3 to 30% by weight.

In the second mode of the method for producing the fluoride fluorescent material, the respective products in the first, second and third steps may be isolated before proceeding to the next step, or these steps may be sequentially conducted without isolating the product in each step. Alternatively, the second and third steps may be performed simultaneously. That is, the addition of the thermally conductive material (the second step) and the addition of the cations such as alkali metal ions and the second complex ion (the third step) may be performed simultaneously.

The method for producing the fluoride fluorescent material may further include, subsequent to the step of arranging the thermally-conductive substances, the step of dispersing and particle-sizing the resultant fluoride fluorescent material. The details of dispersing and particle-sizing the fluoride fluorescent material are the same as the previously described dispersing and particle-sizing treatments of the fluoride fluorescent material.

<Light Emitting Device>

The light emitting device of the present embodiment includes the fluoride fluorescent material and a light source that emits light having a wavelength range of 380 nm to 485 nm. The light emitting device may further includes additional components if necessary. By including the fluoride fluorescent material, the light emitting device can achieve superior durability and long-term reliability. In other words, the light emitting device including the fluoride fluorescent material can maintain the output and the color for a long term, and is suitable for use in severe environments such as use for lighting.

(Light Source)

As the light source (hereinafter, also referred to as "excitation light source"), a light source that generates light in the wavelength range from 380 to 485 nm, which is a short wavelength region of visible light, is used. The light source preferably has an emission peak wavelength (maximum emission wavelength) in the wavelength range from 420 to 485 nm, and, more preferably, in the wavelength range from 440 to 480 nm. By using such a light source, the fluoride fluorescent material can be efficiently excited, and visible light can be effectively utilized. Further, by using an excitation light source having the above-mentioned wavelength range, a light emitting device having high light emission intensity can be provided.

As the excitation light source, a semiconductor light emitting element (hereinafter, also simply referred to as "light emitting element") is preferably used. Using a semiconductor light emitting element as the excitation light source achieves a highly efficient light emitting device that has high output linearity to the input and is resistant to mechanical impact and stable.

A light emitting element that emits visible light in the short wavelength region may be used. As the blue-light or green-light emitting elements for example, those using nitride semiconductors ($In_XAl_YGa_{1-X-Y}N$, $0 \leq X$, $0 \leq Y$, $X+Y \leq 1$) can be employed.

(Fluoride Fluorescent Material)

The details of the fluoride fluorescent material included in the light emitting device are as described above. The fluoride fluorescent material may constitute the light emitting device by, for example, being contained in an encapsulation resin covering the excitation light source. In the light emitting device having the excitation light source covered by an encapsulation resin containing the fluoride fluorescent material, part of the light emitted from the excitation light source is absorbed by the fluoride fluorescent material and emitted as red-light. By using the excitation light source that generates light in the wavelength range from 380 to 485 nm, the emitted light can be more effectively utilized. Thus, loss of the light emitted from the light emitting device can be reduced, so that the light emitting device having high efficiency can be provided.

The amount of the fluoride fluorescent material contained in the light emitting device is not particularly limited, and it can be suitably selected depending on, for example, the excitation light source.

(Another Fluorescent Material)

The light emitting device preferably includes another fluorescent material in addition to the fluoride fluorescent material discussed above. Another fluorescent material may be any fluorescent material that absorbs light from the light source and changes the light in wavelength to light having a different wavelength. Like the previously described fluoride fluorescent material, another fluorescent material may also be contained in the encapsulation resin that constitutes the light emitting device.

Another fluorescent material preferably is at least one selected from the group consisting of nitride fluorescent materials, oxynitride fluorescent materials, and sialon fluorescent materials, all activated mainly by a lanthanoid element, such as Eu or Ce; alkaline-earth halogen apatite fluorescent materials, alkaline-earth metal borate halogen fluorescent materials, alkaline-earth metal aluminate fluorescent materials, alkaline-earth silicate, alkaline-earth sulfide, alkaline-earth thiogallate, alkaline-earth silicon nitride, and germinate, all activated mainly by a lanthanoid element, such as Eu or a transition metal element, such as Mn; rare-earth aluminate and rare earth silicate, all activated mainly by a lanthanoid element, such as Ce; and organics and organic complexes, all activated mainly by a lanthanoid element, such as Eu.

Specific examples of such additional fluorescent materials include, $(Ca,Sr,Ba)_2SiO_4$:Eu, $(Y,Gd)_3(Ga,Al)_5O_{12}$:Ce, $(Si,Al)_6(O,N)_8$:Eu(β-sialon), $SrGa_2S_4$:Eu, $(Ca,Sr)_2Si_5N_8$:Eu, $CaAlSiN_3$:Eu, $(Ca,Sr)AlSiN_3$:Eu, $Lu_3Al_5O_{12}$:Ce, and $(Ca,Sr,Ba,Zn)_8MgSi_4O_{16}(F,Cl,Br,I)$:Eu.

By including additional fluorescent materials, light emitting devices with a wide variety of color tones can be provided.

When such additional fluorescent materials are included in the light emitting device, the amount of such additional fluorescent materials contained are not particularly limited and may be adjusted so as to achieve the desired light-emitting properties.

When the light emitting device includes additional fluorescent materials, it preferably includes green-light emitting fluorescent materials, and more preferably green-light emitting fluorescent materials that absorb light having a wavelength range of 380 nm to 485 nm, and emit light having a wavelength range of 495 nm to 573 nm. The light emitting device including green-light emitting fluorescent materials is more suitable for use in lighting and liquid crystal displays.

When the light emitting device including green-light emitting fluorescent material is used for lighting and liquid crystal displays, the green-light emitting fluorescent material has an emission spectrum with a full width at half maximum of preferably 100 nm or less, and more preferably 80 nm or less, green color of lit object or green image displayed on LCD exhibit deeper green color.

Examples of such green-light emitting fluorescent materials include Eu-activated chlorosilicate fluorescent materials represented by the compositional formula: $M^{11}_8MgSi_4O_{16}X^{11}$:Eu($M^{11}$=Ca,Sr,Ba,Zn;$X^{11}$=F,Cl,Br,I); Eu-activated silicate fluorescent materials represented by $M^{12}_2SiO_4$:Eu($M^{12}$=Mg,Ca,Sr,Ba,Zn); Eu-activated β-sialon fluorescent materials represented by $Si_{6-z}Al_zO_zN_{8-z}$:Eu (0<z<4.2); Eu-activated thiogallate fluorescent materials represented by $M^{13}Ga_2S_4$:Eu($M^{13}$=Mg,Ca,Sr,Ba); and rare-earth aluminate fluorescent materials represented by $(Y,Lu)_3Al_5O_{12}$:Ce. Of these, to achieve desirable color tones and color reproduction range, such green-light emitting fluorescent materials are preferably at least one selected from the group consisting of Eu-activated chlorosilicate fluorescent materials, Eu-activated silicate fluorescent materials, Eu-activated β-sialon fluorescent materials, Eu-activated thiogallate fluorescent materials and rare-earth aluminate fluorescent materials, and are more preferably Eu-activated β-sialon fluorescent materials.

The form of the light emitting device is not particularly limited, and any common form may be appropriately selected. Examples of the forms of the light emitting device include shell type and surface mount type. Generally, the shell type indicates a light emitting device having a shell-shaped outer surface made of resin. The surface mount type indicates a light emitting device having a recess that stores a light emitting element as a light source and is filled with a resin. Another form of the light emitting device is a lens-shaped light emitting device. The lens-shaped light emitting device includes a light emitting element as a light source that is mounted on a flat plate mounting board, and a lens-shaped encapsulation resin containing the fluoride fluorescent material is disposed to cover the light emitting element.

Figure 10:
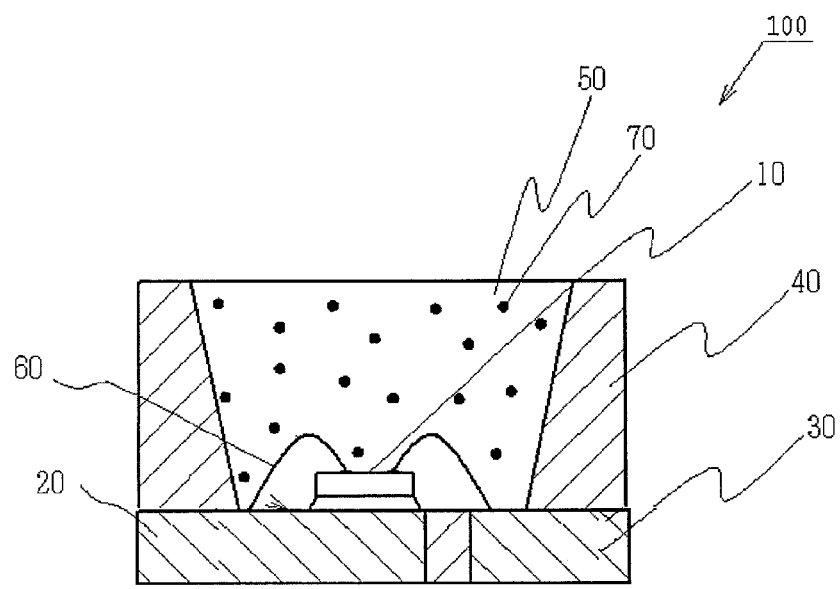
FIG. 10 is a schematic cross-sectional view of a light emitting device according to the present embodiment.

An example of the light emitting device according to an embodiment of the present embodiment will be explained below with reference to the drawings. FIG. 10 is a schematic cross-sectional view showing an example of the light emitting device according to the present embodiment. The light emitting device is an example of surface-mounted light emitting devices.

The light emitting device 100 includes a light emitting element 10 composed of a gallium nitride compound semiconductor that emits short-wavelength visible light (e.g., 380 nm to 485 nm); and a molded body 40 on which a light emitting element 10 is disposed. The molded body 40 includes the first lead 20 and the second lead 30, and is integrally formed using a thermoplastic resin or a thermosetting resin. The molded body 40 has a recess defined by a bottom surface and side surfaces, and the light emitting element 10 is disposed on the bottom surface of the recess. The light emitting element 10 has a pair of electrodes, positive and negative, and the pair of the electrodes is electrically connected to the first lead 20 and the second lead 30 with a wire 60. The light emitting element 10 is encapsulated by an encapsulation member 50. The encapsulation member 50 is preferably a thermosetting resin such as epoxy resin, silicone resin, epoxy-modified silicone resin, and modified silicone resin. The encapsulation member 50 contains the fluoride fluorescent material 70 that changes the wavelength of the light emitted from the light emitting element 10.

EXAMPLES

Hereinbelow, the present embodiment will be described in more detail with reference to the following Examples, which should not be construed as limiting the scope of the present embodiment.

Preparation Example 1

16.25 g of $K_2MnF_6$ was weighed and dissolved in 1000 g of a 55% by weight aqueous HF solution, and then 450 g of a 40% by weight aqueous $H_2SiF_6$ solution was added to the resultant solution to prepare solution A. 195.10 g of $KHF_2$ was weighed and dissolved in 200 g of a 55% by weight aqueous HF solution to prepare solution B.

Then, while solution B was stirred at room temperature (25° C.), solution A was added dropwise to solution B over about 20 minutes. The resultant precipitate was taken by solid-liquid separation, and then the precipitate was washed with ethanol and dried for 10 hours at 100° C. to prepare fluoride particles 1.

Example 1

A fluoride fluorescent material was prepared in the following manner using the fluoride particles 1 obtained in Preparation Example 1.

1.5 g of alumina (α-type, central particle size: 0.3 to 0.6 μm, primary particle size: 0.3 μm) was weighed and added to 100 g of pure water to prepare an alumina slurry. 50 g of fluoride particles 1 obtained in Preparation Example 1 was weighed and added to a solution containing 150 g of pure water and 0.5 g of hydrogen peroxide (30%) to prepare a fluoride particle-dispersion. The alumina slurry was then added to the fluoride particle-dispersion, and stirred for 15 minutes at room temperature. Stirring was stopped and the mixture was left to stand, and the resultant precipitate was taken by solid-liquid separation. The precipitate was then washed with ethanol. The resultant precipitate was then dried at 100° C. for 10 hours to prepare a fluoride fluorescent material.

The amount of alumina used was 3.0% by weight based on the fluoride particles, and the weight (content) of the alumina attached to the fluoride particles was 2.6% by weight based on the fluoride particles.

Examples 2 to 4

Fluoride fluorescent materials were individually prepared in the same manner as Example 1 except that the weight of alumina used in preparing an alumina slurry was changed to 0.5 g, 3.0 g, and 4.5 g in Examples 2, 3, and 4, respectively.

The amounts of the alumina used were 1.0% by weight, 6.0% by weight, and 9.0% by weight based on the fluoride particles in Examples 2, 3, and 4, respectively, and the weights (content) of the alumina attached to the fluoride particles were 0.9% by weight, 4.8% by weight, and 7.9% by weight based on the fluoride particles in Examples 2, 3, and 4, respectively.

Example 5

15.0 g of alumina (α-type, central particle size: 0.3 to 0.6 μm, primary particle size: 0.3 μm) was weighed and added to 485 g of pure water. The mixture was added to a 2-liter dispersing container containing 800 g of ϕ2 mm-alumina balls, and roll-dispersed for 6 hours to prepare an alumina dispersing slurry.

50 g of fluoride particles 1 prepared in Preparation Example 1 was weighed, and 50 g of the resultant alumina dispersing slurry was added to a solution containing 150 g of pure water and 0.5 g of hydrogen peroxide (30%). The mixture was stirred for 15 minutes and then stirring was stopped, and the mixture was left to stand. The resultant precipitate was taken by solid-liquid separation and the precipitate was washed with ethanol. The resultant precipitate was then dried at 100° C. for 10 hours to prepare a fluoride fluorescent material.

The amount of the alumina used was 3.0% by weight of fluoride particles, and the weight (content) of the alumina attached to the fluoride particles was 2.6% by weight of the fluoride particles.

Comparative Example 1

Fluoride particles 1 obtained in Preparation Example 1 were used as they are for the fluoride fluorescent material of Comparative Example 1.

Example 6

14.23 g of $K_2MnF_6$ was weighed and dissolved in 400 g of a 55% aqueous HF solution to prepare a first solution. 156.20 g of $KHF_2$ was weighed and dissolved in 870 g of a 55% aqueous HF solution to prepare a second solution. 339.48 g of a 40% by weight aqueous $H_2SiF_6$ solution was weighed to prepare a third solution.

Then, while the second solution was stirred at room temperature, the first solution and the third solution were added dropwise over about 40 minutes. When 90% by weight of each of the first and third solutions was added dropwise, 4.92 g of alumina dispersed in pure water was added and stirred, followed by dropwise addition of the remaining first and third solutions. The resultant precipitate was taken by solid-liquid separation, and the precipitate was washed with ethanol, and then dried at 100° C. for 10 hours to prepare a fluoride fluorescent material.

The amount of alumina used was 3.0% by weight of the fluoride fluorescent material, and the weight (content) of the alumina attached to the fluoride particles was 2.5% by weight of the fluoride fluorescent material.

Examples 7 to 8

Fluoride fluorescent materials were individually prepared in the same manner as Example 6 except that the amount of alumina used was changed to 1.0% by weight and 6.0% by weight in Examples 7 and 8, respectively.

The weight (content) of the alumina attached to fluoride particles was 0.8% by weight and 4.9% by weight in Examples 7 and 8, respectively.

Comparative Example 2

A fluoride fluorescent material was prepared in the same manner as Example 6 except that no alumina was added.

<Evaluation>
(SEM Image)

Using a scanning electron microscope (SEM), SEM images of the fluoride fluorescent materials were obtained.

Figure 5:
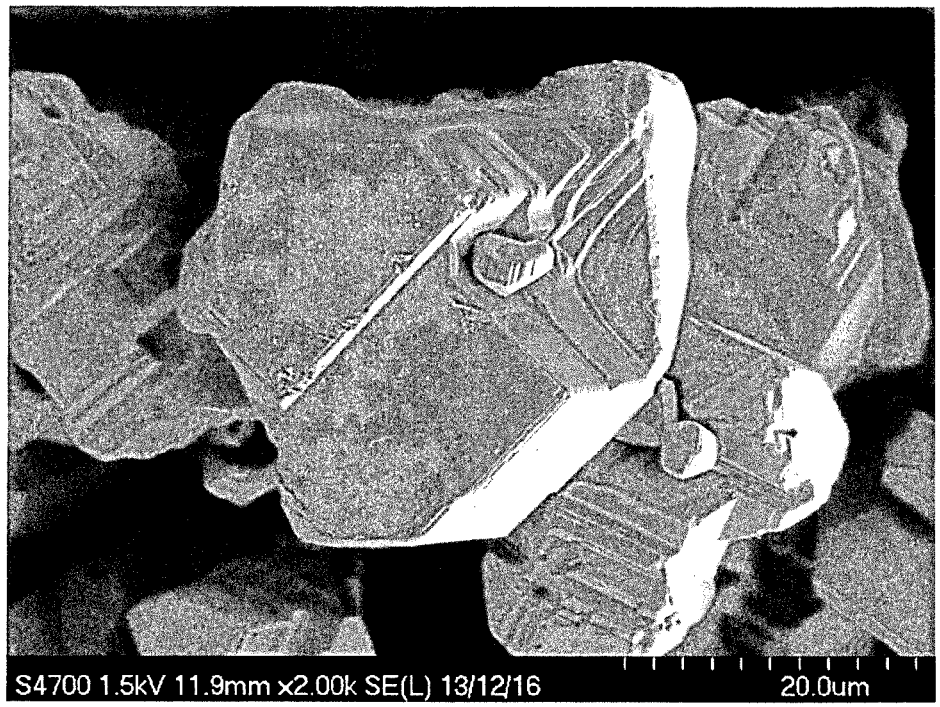
FIG. 5 is an SEM image of a fluoride fluorescent material according to Comparative Example 1.
Figure 6:
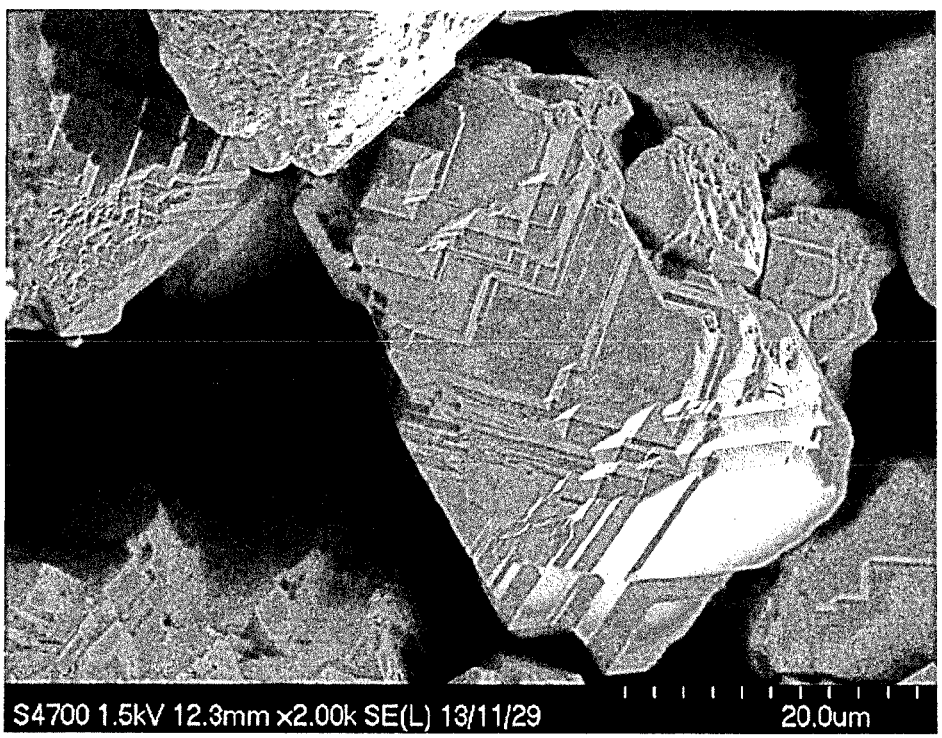
FIG. 6 is an SEM image of a fluoride fluorescent material according to Comparative Example 2.

FIG. 1 shows an SEM image (×2000) of the fluoride fluorescent material obtained in Example 3; FIG. 2 shows an SEM image (×2000) of the fluoride fluorescent material obtained in Example 5; FIG. 3 shows an SEM image (×2000) of the fluoride fluorescent material obtained in Example 6; FIG. 4 shows an enlarged SEM image (×10000) of the fluoride fluorescent material obtained in Example 6; FIG. 5 shows an SEM image (×2000) of the fluoride fluorescent material obtained in Comparative Example 1; and FIG. 6 shows an SEM image (×2000) of the fluoride fluorescent material obtained in Comparative Example 2.

(Light-emitting Property)

Typical optical properties were determined for the fluoride fluorescent materials obtained above. Table 1 shows the measured chromaticity coordinates, reflectance (%) at 460 nm, luminous or light-emitting energy efficiency (ENG efficiency, %) at an excitation wavelength of 460 nm for each of them.

The light-emitting energy efficiency refers to light-emitting efficiency relative to the absorbed light energy.

(Durability)

A semiconductor laser that emits light having a wavelength of 450 nm was prepared, and its temperature was adjusted to stabilize the light output. 0.34 g of the fluoride fluorescent material was placed into a cell for measuring powder brightness, and the fluoride fluorescent material in the cell was continuously irradiated with the light from the semiconductor laser. The current applied on the semiconductor laser was adjusted so that the light density was 3.5 W/cm². The light from the portion irradiated with laser is collected by a light electron multiplier to measure changes in powder brightness. At this time, the laser light reflected from the fluorescent material was removed using an optical filter to avoid the influence of the laser light on the powder brightness.

Figure 7:
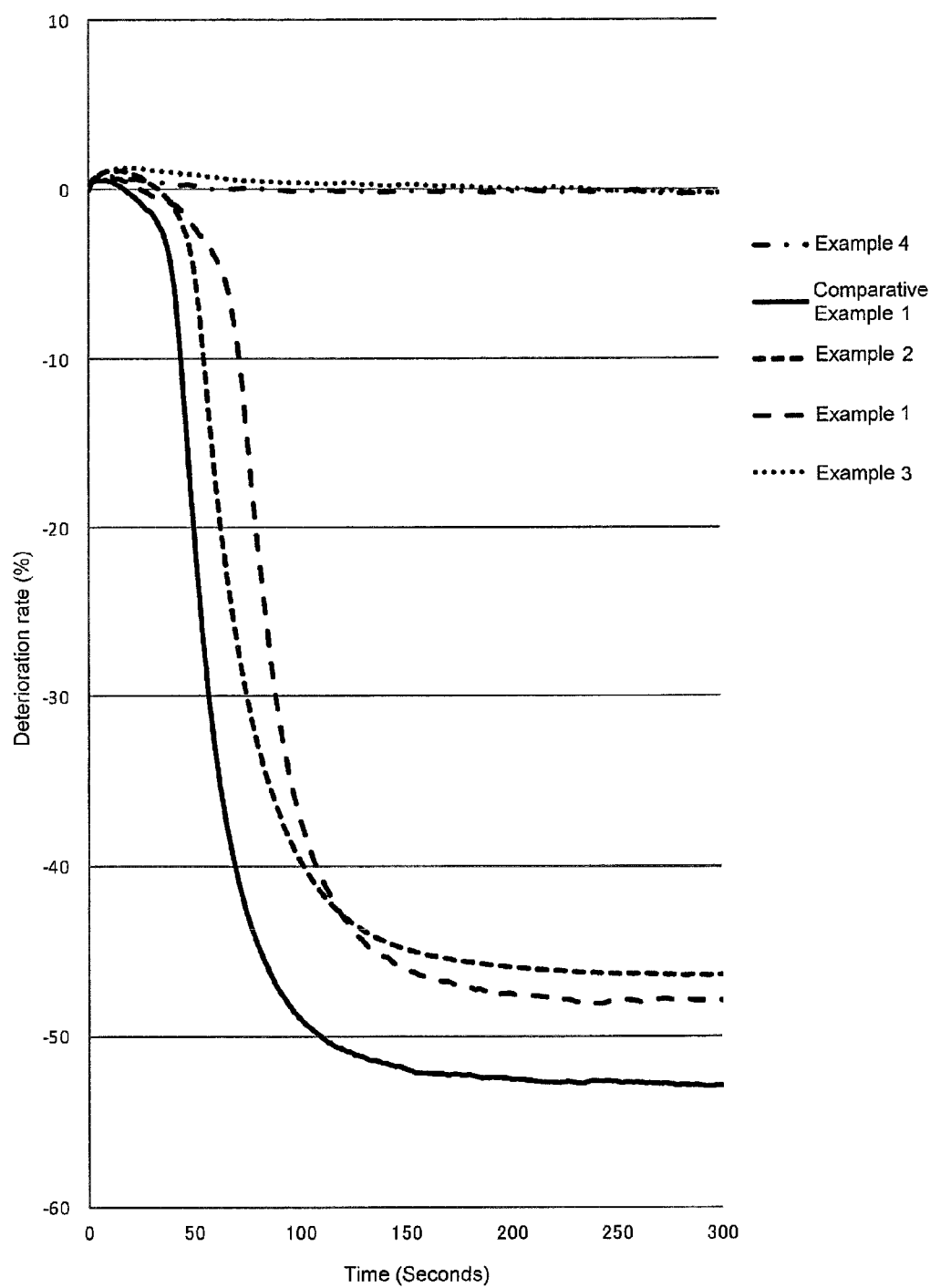
FIG. 7 is a graph showing the results of a durability evaluation of a fluoride fluorescent material according to the present embodiment.
Figure 8:
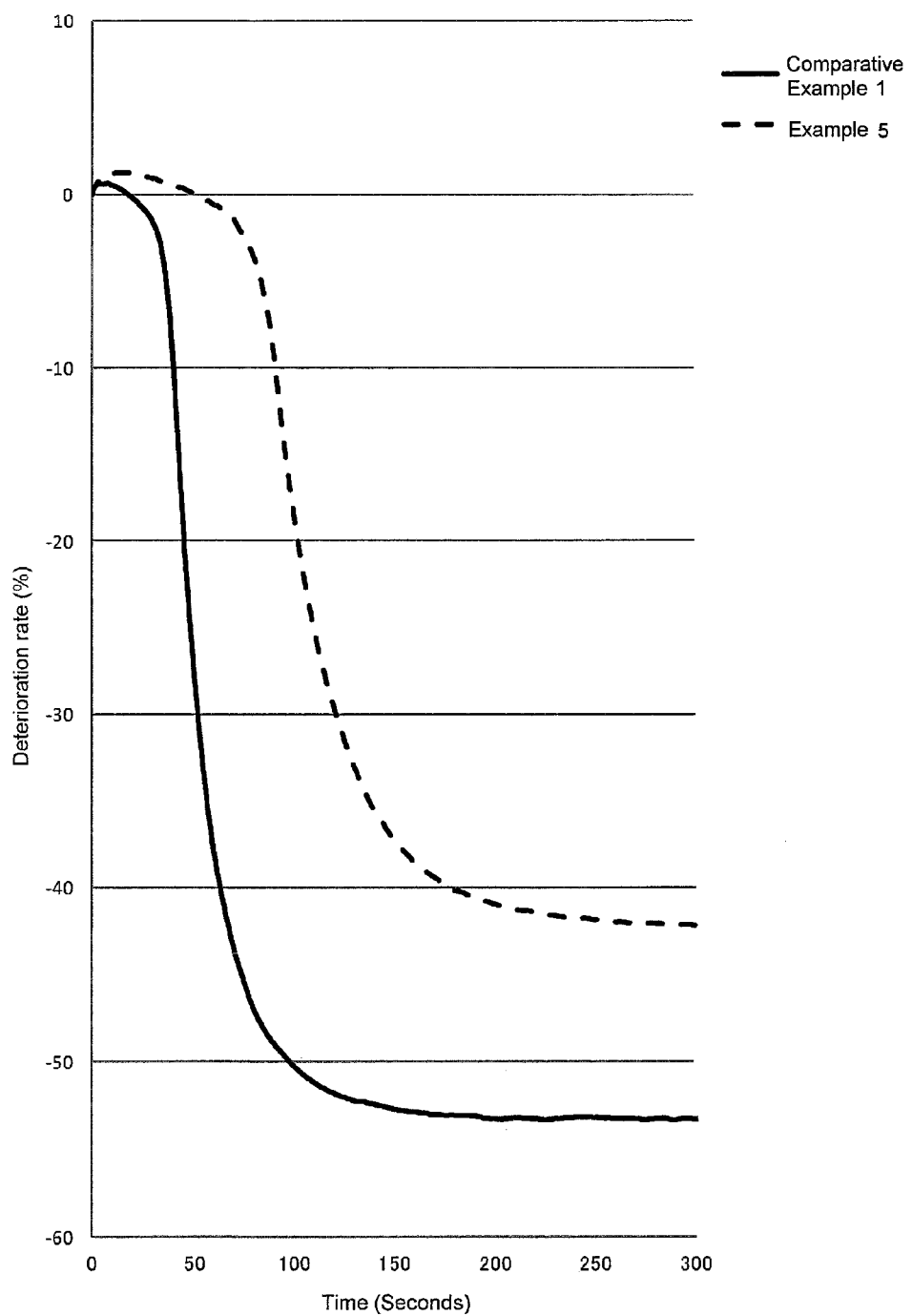
FIG. 8 is a graph showing the results of a durability evaluation of a fluoride fluorescent material according to the present embodiment.
Figure 9:
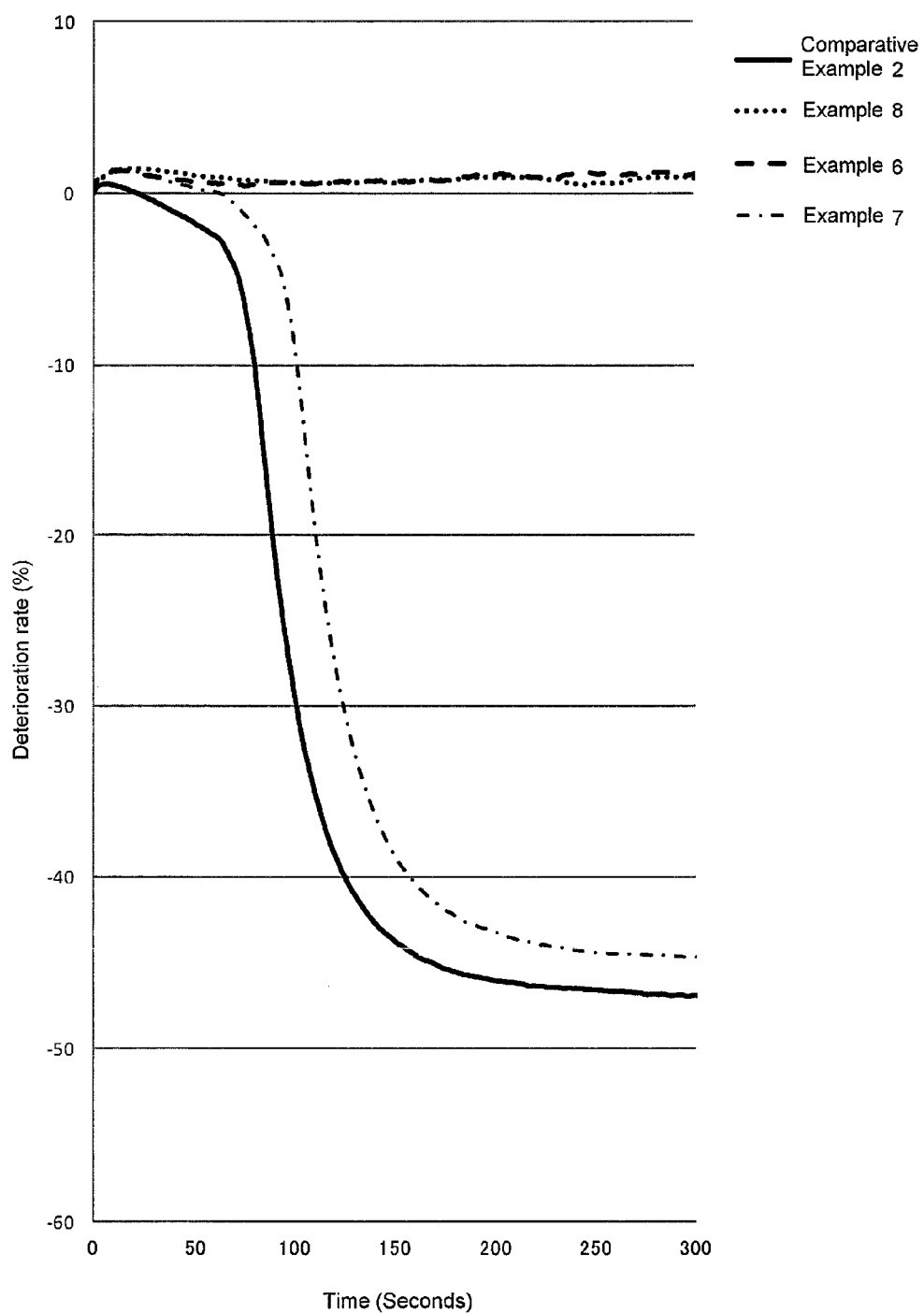
FIG. 9 is a graph showing the results of a durability evaluation of a fluoride fluorescent material according to the present embodiment.

Table 1 and FIGS. 7 to 9 show the relationships between the laser light irradiation duration (seconds) and degradation rate of Examples and Comparative Examples. The degradation rate indicates the rate of decrease in emission brightness due to the irradiation of the laser light.

TABLE 1

| | Content (%) | Chromaticity coordinates x | Chromaticity coordinates y | Reflectance (%) | ENG efficiency (%) | Deterioration rate (%) 50 s | 75 s | 100 s | 125 s | 150 s |
|---|---|---|---|---|---|---|---|---|---|---|
| Comparative Example 1 | 0.0 | 0.679 | 0.312 | 35.4 | 110.7 | −20.1 | −43.0 | −49.0 | −51.1 | −52.0 |
| Example 2 | 0.9 | 0.679 | 0.312 | 38.5 | 111.2 | −5.0 | −30.2 | −39.7 | −43.4 | −44.9 |
| Example 1 | 2.6 | 0.680 | 0.312 | 42.0 | 112.2 | −2.3 | −14.6 | −37.2 | −43.8 | −46.1 |
| Example 3 | 4.8 | 0.680 | 0.312 | 46.4 | 110.8 | 0.8 | 0.5 | 0.4 | 0.4 | 0.3 |
| Example 4 | 7.9 | 0.678 | 0.312 | 50.3 | 110.5 | 0.3 | 0.1 | 0.0 | 0.0 | −0.1 |
| Example 5 | 2.6 | 0.680 | 0.312 | 43.4 | 112.9 | 0.0 | −2.4 | −18.1 | −31.3 | −37.2 |
| Comparative Example 2 | 0.0 | 0.679 | 0.312 | 33.3 | 106.0 | −1.8 | −6.4 | −29.2 | −40.0 | −43.8 |
| Example 7 | 0.8 | 0.679 | 0.312 | 36.3 | 106.8 | 0.3 | −1.1 | −8.3 | −30.0 | −38.7 |
| Example 6 | 2.5 | 0.680 | 0.312 | 38.7 | 104.9 | 0.6 | 0.4 | 0.7 | 0.7 | 0.7 |
| Example 8 | 4.9 | 0.680 | 0.312 | 42.9 | 105.4 | 1.0 | 0.7 | 0.6 | 0.6 | 0.6 |

Table 1 clearly shows that the fluoride fluorescent materials of the present embodiment have improved durability without any adverse effects on light-emitting properties, such as energy efficiency.

(Reliability of the Light Emitting Device)

35.5 parts by weight of the alumina-attached fluoride fluorescent material obtained in Example 6, 12.7 parts by weight of β-sialon having an emission peak at 540 nm, 2.0 parts by weight of silica filler, and 100 parts by weight of silicone resin (Shin-Etsu Chemical Co., Ltd.) were mixed and dispersed, followed by defoaming to obtain a resin composition containing the particles of a fluorescent material. This resin composition containing the particles of a fluorescent material was then poured and filled into an LED package (emission peak wavelength at 452 nm), followed by heating at 150° C. for 4 hours to cure the resin composition. A light emitting device was manufactured in accordance with these steps.

The resultant light emitting device was placed in a thermostatic chamber, which was set at a temperature of 85° C., and the light was turned on at 150 mA, and the reliability of the light emitting device was tested.

The reliability of the light emitting device was evaluated by measuring the color tone and the light lumen maintenance factor before and after turning the light on in the thermostatic chamber. Specifically, the reliability of the color tone was evaluated by the amount of shift in the color tone that is obtained by comparing color tone at initial lighting with that of after 1000 hours of lighting in the thermostatic chamber. The amount of difference in color tone was evaluated as value x and value y of chromaticity coordinates.

$\Delta x$=value $x$ with a lapse of 1000 hours−value $x$ at initial lighting $\Delta y$=value $y$ with a lapse of 1000 hours−value $y$ at initial lighting The light lumen maintenance factor was evaluated by measuring the luminous flux before lighting in the thermostatic chamber compared with the luminous flux after 1000 hours of lighting in the thermostatic chamber.

Light lumen maintenance factor (%)=(luminous flux after 1000 hours of lighting/luminous flux before lighting)×100

Table 2 shows the results.

Meanwhile, a light emitting device was produced using a resin composition containing fluorescent material obtained from the fluoride fluorescent material of Comparative Example 2 in the same manner as described above. Specifically, 36.5 parts by weight of the fluoride fluorescent material obtained in Comparative Example 2, 13.5 parts by weight of β-sialon having an emission peak at 540 nm, 2.0 parts by weight of silica filler, and 100 parts by weight of silicone resin (Shin-Etsu Chemical Co., Ltd.) were mixed and dispersed, followed by defoaming to obtain a resin composition containing fluorescent material, and a light emitting device was manufactured through the same steps as mentioned above.

The reliability test of this light emitting device was performed in the same manner. The results of the test are also shown in Table 2.

TABLE 2

| | Amount of shift in color tone Δx | Δy | Light lumen maintenance factor (%) |
|---|---|---|---|
| Example 6 | −0.013 | −0.005 | 86.9 |
| Comparative Example 2 | −0.016 | −0.008 | 85.3 |

Table 2 shows that light emitting devices including the fluoride fluorescent material in Example 6 exhibit less shift in color tone and a higher light lumen maintenance factor than light emitting devices including the fluoride fluorescent material of Comparative Example 2. Thus light emitting devices including the fluoride fluorescent material of Example 6 have superior reliability as a light emitting device.

Comparative Example 3

A fluoride fluorescent material was prepared in the same manner as Example 1 except that silicon oxide particles having a lower thermal conductivity than fluoride particles were used instead of alumina.

The durability of the resultant fluoride fluorescent material was evaluated in the same manner, and no improvement in durability was observed.

The fluoride fluorescent material according to the present embodiment has superior durability, and a light emitting device including the fluoride fluorescent material has reduced output decline and changes in chromaticity over time. The light emitting device can be used as, for example, white color light sources for lighting, backlight light sources, LED displays, traffic lights, lighting switches, various sensors and various indicators that use, in particular, blue light emitting diodes as a light source, and exhibits superior durability and light-emitting properties.

As described above, it should be obvious that various other embodiments are possible without departing the spirit and scope of the present invention. Accordingly, the scope and spirit of the present invention should be limited only by the following claims.

All publications, patent applications, and technical standards mentioned in this specification are herein incorporated by reference to the same extent as if each individual publication, patent application, or technical standard was specifically and individually indicated to be incorporated by reference.

What is claimed is:

1. A fluoride fluorescent material, comprising:
   a fluoride particle having a chemical composition represented by the formula (I):

$$A_2[M_{1-a}Mn^{4+}{}_aF_6] \quad (I)$$

wherein A is at least one cation selected from the group consisting of $K^+$, $Li^+$, $Na^+$, $Rb^+$, $Cs^+$ and $NH_4^+$; M is at least one element selected from the group consisting of elements from Group 4 of the periodic table and elements from Group 14 of the periodic table; and variable a satisfies $0<a<0.2$; and
   a thermally-conductive substance having a higher thermal conductivity than the fluoride particle, being arranged on at least a portion of a surface of the fluoride particle, and being in the form of a particle.

2. The fluoride fluorescent material according to claim 1, wherein the thermally-conductive substance is at least one selected from the group consisting of aluminum oxide, titanium oxide, beryllium oxide, zinc oxide, yttrium oxide, magnesium carbonate, diamond, boron nitride, aluminum nitride, rare-earth aluminate and metal oxynitride.

3. The fluoride fluorescent material according to claim 1, wherein the thermally-conductive substance is partially surrounded by a crystal of the fluoride particle, and the thermally-conductive substance and the fluoride particle are in contact with each other on a plurality of surfaces thereof.

4. The fluoride fluorescent material according to claim 1, wherein a portion of the thermally-conductive substance is embedded in the fluoride particle, and remaining portions of the thermally-conductive substance are exposed.

5. The fluoride fluorescent material according to claim 1, wherein the thermally-conductive substance has a volume average particle size of 5 nm to 10 μm.

6. The fluoride fluorescent material according to claim 1, wherein the thermally-conductive substance is aluminum oxide, and the aluminum oxide constitutes from 0.1% by weight to 20% by weight.

7. A method for producing a fluoride fluorescent material comprising:
   the first step of contacting:
   a first complex ion comprising a tetravalent manganese ion;
   at least one cation selected from the group consisting of $K^+$, $Li^+$, $Na^+$, $Rb^+$, $Cs^+$ and $NH_4^+$; and
   a second complex ion comprising at least one element selected from the group consisting of elements from Group 4 of the periodic table and elements from Group 14 of the periodic table in a liquid medium containing hydrogen fluoride to obtain a fluoride particle having a chemical composition represented by the formula (I):

$$A_2[M_{1-a}Mn^{4+}{}_aF_6] \quad (I)$$

wherein A is at least one cation selected from the group consisting of $K^+$, $Li^+$, $Na^+$, $Rb^+$, $Cs^+$ and $NH_4^+$; M is at least one element selected from the group consisting of elements from Group 4 of the periodic table and elements from Group 14 of the periodic table; and variable a denotes a number that satisfies $0<a<0.2$;
   the second step of contacting the resultant fluoride particle with a thermally-conductive substance having a higher thermal conductivity than the fluoride particle in a liquid medium to obtain a fluoride particle having the thermally-conductive substance arranged on at least a portion of a surface thereof; and
   the third step of contacting the fluoride particle, on which the thermally-conductive substance is arranged, with at least the cation and the second complex ion in a liquid medium.

8. The method for producing a fluoride fluorescent material according to claim 7, wherein the first step comprises mixing:
   a solution A containing at least the first complex ion, the second complex ion comprising at least one element selected from the group consisting of elements from Group 4 of the periodic table and elements from Group 14 of the periodic table and a fluorine ion, and hydrogen fluoride; and
   a solution B containing at least the cation and hydrogen fluoride.

9. The method for producing a fluoride fluorescent material according to claim 7, wherein the first step comprises mixing:
   a first solution containing at least the first complex ion and hydrogen fluoride,
   a second solution containing at least the cation and hydrogen fluoride, and
   a third solution containing at least the second complex ion comprising at least an element selected from the group consisting of elements from Group 4 of the periodic table and elements from Group 14 of the periodic table and a fluorine ion to obtain a fluoride particle.

10. The method for producing a fluoride fluorescent material according to claim 7, wherein the first step further comprises dispersing and/or particle-sizing the resultant fluoride particle.

11. The method for producing a fluoride fluorescent material according to claim 7, further comprising, subsequent to the third step, the step of dispersing and/or particle-sizing the resultant fluoride particle.

12. A light emitting device comprising:
   a fluoride fluorescent material according to claim 1; and
   a light source that emits light in a wavelength range of from 380 to 485 nm.

* * * * *